US006625192B2

United States Patent
Arbel et al.

(10) Patent No.: US 6,625,192 B2
(45) Date of Patent: Sep. 23, 2003

(54) HIGH REPETITION RATE OPTICAL PULSE GENERATOR

(75) Inventors: David Arbel, Haifa (IL); Uzi Koren, Karmiel (IL); Micha Zimmermann, Haifa (IL)

(73) Assignee: Cyoptics (Israel) Ltd., Yokneam (IL)

( * ) Notice: Subject to any disclaimer, the term of this patent is extended or adjusted under 35 U.S.C. 154(b) by 142 days.

(21) Appl. No.: 09/767,204

(22) Filed: Jan. 22, 2001

(65) Prior Publication Data

US 2001/0046250 A1 Nov. 29, 2001

Related U.S. Application Data

(60) Provisional application No. 60/177,405, filed on Jan. 20, 2000.

(51) Int. Cl.$^7$ ................................. H01S 3/09
(52) U.S. Cl. ............................ 372/69; 372/87; 372/11; 372/20; 372/102
(58) Field of Search ........................ 372/18, 20, 102, 372/101, 69, 87, 11

(56) References Cited

U.S. PATENT DOCUMENTS

| | | | | |
|---|---|---|---|---|
| 4,513,406 A | * | 4/1985 | Ishihara | 369/32 |
| 4,786,132 A | | 11/1988 | Gordon | 350/96.19 |
| 5,007,062 A | | 4/1991 | Chesnoy | 372/26 |
| 5,040,183 A | | 8/1991 | Chen et al. | 372/25 |
| 5,077,816 A | | 12/1991 | Glomb et al. | 385/37 |
| 5,181,213 A | | 1/1993 | Shinokura et al. | 372/30 |
| 5,305,336 A | * | 4/1994 | Adar | 372/18 |
| 5,586,138 A | * | 12/1996 | Yokoyama | 372/97 |
| 5,706,301 A | | 1/1998 | Lagerstrom | 372/32 |
| 5,790,579 A | | 8/1998 | Lee et al. | 372/45 |
| 5,870,417 A | | 2/1999 | Verdiell et al. | 372/32 |
| 5,914,972 A | | 6/1999 | Siala et al. | 372/33 |
| 6,031,851 A | * | 2/2000 | Shimizu | 372/18 |

FOREIGN PATENT DOCUMENTS

| | | |
|---|---|---|
| EP | 949729 A2 | 10/1999 |
| JP | 7015083 A | 1/1995 |
| JP | 7193329 A | 7/1995 |
| JP | 7307512 A | 11/1995 |
| JP | 8321652 A | 12/1996 |
| JP | 11145554 A | 5/1999 |
| WO | WO99/39411 | 8/1999 |

OTHER PUBLICATIONS

D.M. Bird et al., "Narrow Line Semiconductor Laser Using Fibre Grating", Electronic Letters 27(13), Jun. 20, 1991, pp. 1115–1116.

P.A. Morton et al., "Package Hybrid Soliton Pulse Source Results and 270 Terabit.km/sec Soliton Transmission", IEEE Photonics Technology Letters 7(1), Jan. 1995, pp. 111–113.

(List continued on next page.)

Primary Examiner—Leon Scott, Jr.
(74) Attorney, Agent, or Firm—Darby & Darby

(57) ABSTRACT

An optical pulse generator, consisting of a semiconductor device and an optical output assembly. The semiconductor device includes an optically-active region having a gain section and a saturable absorber (SA) section, which are adapted to generate coherent optical pulses. The device also includes an output facet for coupling therethrough of the optical pulses generated in the optically-active region, and an SA electrode for application of a radio-frequency (RF) modulation of a desired frequency to the SA section.

The optical output assembly is optically coupled to the output facet of the semiconductor device so as to partially reflect the coherent optical pulses within a predetermined wavelength range. The assembly is positioned so as to form, together with the semiconductor device, a laser cavity having a resonant wavelength within the predetermined wavelength range and having an optical length such that a period of the RF modulation substantially equals a round-trip time for one of the pulses in the cavity, whereby the coherent optical pulses are output through the optical output assembly at a repetition rate substantially equal to the RF modulation.

24 Claims, 5 Drawing Sheets

OTHER PUBLICATIONS

P.A. Morton et al., "Hybrid Soliton Pulse Source with Fibre External Cavity and Bragg Reflector", Electronic Letters 28(6), Mar. 12, 1992, pp. 561–562.

D.J. Derickson et al., "Short Pulse Generation Using Multisegment Mode–Locked Semiconductor Lasers", IEEE Journal of Quantum Electronics 28(10), Oct. 1992, p. 2186–2202.

P.B. Hansen et al., "5.5–mm Long InGaAsP Monolithic Extended–Cavity Laser with an Integrated Bragg–Reflector for Active Mode–Locking", IEEE Photonics Technology Letters 4(3), Mar. 1992, pp. 215–217.

J.–P. Elbers et al., "3.2 Tbit/s (80×40 Gbit/s) BiDirectional DWDM/ETDM Transmission", Siemens AG, German, PD2–5, ECOC 1999, pp. 32–33. No Date.

Y.K. Chen et al., "Monolithic Colliding–Pulse Mode–Locked Quantum–Well Lasers", IEEE Journal of Quantum Electronics 28(10), Oct. 1992, pp. 2176–2185.

* cited by examiner

HIGH REPETITION RATE OPTICAL PULSE GENERATOR

CROSS-REFERENCE TO RELATED APPLICATIONS

This application claims the benefit of U.S. Provisional Patent Application No. 60/177,405, filed Jan. 20, 2000, which is incorporated herein by reference.

FIELD OF THE INVENTION

The present invention relates generally to lasers, and specifically to lasers generating pulses at high rates.

BACKGROUND OF THE INVENTION

There is a continuing demand for increasing the rate of transference of data in data communication systems. Optical communication systems are able to satisfy the demand because of their inherently extremely high bandwidth, and one of the components of such a communication system is a source able to generate optical pulses at very high repetition rates. Semiconductor laser diodes operating at wavelengths of the order of 1 $\mu$m form the basis of many sources known in the art.

An article titled "5.5-mm Long InGaAsP Monolithic Extended-Cavity Laser with an Integrated Bragg-Reflector for Active Mode-Locking," by Hansen et al., in the March, 1992, issue of *IEEE Photonics Technology Letters*, describes a monolithic mode-locked, semiconductor laser which generates transform-limited 20 ps wide pulses of 1.55 $\mu$m wavelength at a rate of 8.1 GHz.

An article titled "Monolithic Colliding-Pulse Mode-Locked Quantum-Well Lasers," by Chen et al., in the October, 1992, issue of *IEEE Journal of Quantum Electronics*, describes a monolithic mode-locked semiconductor laser generating pulses at ultra high rates, up to 160 GHz. The use of colliding pulses at a saturable absorber incorporated in the monolithic cavity further shortens the pulses, so that pulses having widths of the order of 1 ps are produced.

A drawback common to all monolithic constructions, however, is that manufacturing process limitations cause inherently wide ranges in emitted wavelength and repetition rate. The drawback can be overcome by using an external cavity system, comprising a semiconductor laser chip and an external narrow band element, typically a fiber Bragg grating (FBG).

European Patent Application 949,729/A2, to Meliga et al., describes a module having a semiconductor laser chip coupled to an external grating written in a fiber optic. A portion of the fiber optic couples the chip and the grating. The grating acts as a partially reflecting mirror, emitting light having a wavelength defined by the grating spacing into the fiber optic.

U.S. Pat. No. 5,305,336 to Adar et al., whose disclosure is incorporated herein by reference, describes a semiconductor laser chip coupled to an external grating. A DC bias and a radio-frequency (RF) current drive the chip via two electrodes, one of which functions as a ground electrode. The RF current and DC bias modulate the gain of the chip, and switches it between a net gain mode and a net absorption mode, so that the system provides pulses at the radio-frequency. The radio-frequency is set close to a fundamental cavity frequency, defined by a time for pulses within the system to travel a round-trip, which has the effect of mode-locking the system and emitting light pulses.

SUMMARY OF THE INVENTION

It is an object of some aspects of the present invention to provide apparatus and methods for generating short coherent optical pulses having a high repetition rate.

It is a further object of some aspects of the present invention to provide apparatus and methods for setting the repetition rate of the optical pulses independent of a wavelength of the pulses.

In preferred embodiments of the present invention, an optical system couples a semiconductor diode laser device to a fiber optic comprising a wavelength selective partial reflector, most preferably a fiber Bragg grating (FBG). The diode laser device comprises a relatively long gain section, and a short section operating as an electrically modulated saturable absorber, each section being controlled by a separate electrode. The device preferably has a third ground electrode. One facet of the device is coated to act as a first highly reflecting mirror. The partial reflector acts as a second mirror, so that an optical resonant cavity is formed between the two mirrors. When the partial reflector comprises an FBG, the wavelength at which the cavity resonates, and which is partially transmitted via the FBG into the fiber optic, is defined by the grating period of the FBG. An optical length of the cavity can be set by positioning the optical system and/or the fiber optic relative to the laser device, thus enabling the cavity to be tuned to the wavelength defined by the partial reflector.

A radio-frequency (RF) signal with a DC bias is injected into the saturable absorber section. The period of the RF signal is set so that it corresponds to the time for a pulse to make a round-trip within the cavity, thus locking the modes of the laser in phase and causing the laser device to emit short mode-locked pulses at a repetition rate equal to the frequency of the RF signal. The saturable absorber section in the cavity is positioned to cause a colliding pulse effect in the saturable absorber, further shortening the pulses so that the temporal pulse widths are effectively at the transform limit set by the frequency bandwidth of the partial reflector. Thus, the combination of the dual-section laser device coupled to the wavelength selective partial reflector enables the laser cavity to be produced so as to generate short transform-limited pulses having a substantially invariant wavelength. Furthermore, the repetition rate of the pulses can be conveniently set independent of the wavelength by appropriately setting the length of the cavity.

In some preferred embodiments of the present invention, the saturable absorber section is positioned adjacent to the highly reflecting facet, so that the pulses propagating in the cavity collide at the facet. In other preferred embodiments of the present invention, the saturable absorber section is positioned at an optical center of the cavity, so that pulses reflected from the opposing cavity mirrors collide in the absorber section.

In some preferred embodiments of the present invention, the optical system coupling the output of the laser device to the fiber optic comprises a single converging lens separated from the device and the fiber optic. Positions of the lens and the fiber optic are independently set when adjusting the laser cavity. In an alternative preferred embodiment, the single lens is cemented to, or is integral with, the fiber optic, so that settings for the cavity are made by adjusting the position of the fiber optic. The single lens focuses the diverging output of the device onto the fiber optic.

In other preferred embodiments of the present invention, the optical system comprises a plurality of lenses, one of which may be in contact or integral with the fiber optic. As for the single lens, the plurality of lenses focus the diverging output of the device onto the fiber optic.

There is therefore provided, according to a preferred embodiment of the present invention, an optical pulse generator, including:

a semiconductor device, which includes:
 an optically-active region including a gain section and a saturable absorber (SA) section, which are adapted to generate coherent optical pulses;
 an output facet for coupling therethrough of the optical pulses generated in the optically-active region; and
 an SA electrode for application of a radio-frequency (RF) modulation of a desired frequency to the SA section; and
an optical output assembly, optically coupled to the output facet of the semiconductor device so as to partially reflect the coherent optical pulses within a predetermined wavelength range, and positioned so as to form, together with the semiconductor device, a laser cavity having a resonant wavelength within the predetermined wavelength range and having an optical length such that a period of the RF modulation substantially equals a round-trip time for one of the pulses in the cavity, whereby the coherent optical pulses are output through the optical output assembly at a repetition rate substantially equal to the RF modulation.

Preferably, the semiconductor device includes a gain electrode for application of a current to the gain section.

Further preferably, the current includes a substantially DC current.

Preferably, the semiconductor device includes a common electrode which acts as a return for the gain electrode and the SA electrode.

Preferably, the semiconductor device includes a highly reflecting facet which together with the output facet encloses the optically-active region.

Further preferably, the output facet is coated by an antireflection coating.

Preferably, the optical output assembly includes a fiber optic having a fiber Bragg grating (FBG) which partially reflects the optical pulses within the predetermined wavelength range responsive to a period of the FBG, and wherein the fiber optic transmits the optical pulses.

Further preferably, the optical output assembly includes one or more lenses which focus the coherent optical pulses between the fiber optic and the output facet.

Preferably, the one or more lenses include a lens fixedly coupled to the fiber optic.

Further preferably, at least one of the one or more lenses and the fiber optic are positioned so as to form the laser cavity.

Preferably, the generator includes a DC bias current which is applied to the SA electrode.

Preferably, the gain section is positioned adjacent to the output facet.

Preferably, a length of the SA section is substantially less than a length of the gain section.

Preferably, the semiconductor device includes a passive waveguide section coupled to the optically-active region so as to form the laser cavity.

Preferably, the semiconductor device includes a highly reflecting facet which together with the output facet encloses the optically-active region and the passive waveguide section, and wherein the SA region is positioned adjacent to the output facet, so that a first optical length from the SA section to the highly reflecting facet is substantially equal to half a second optical length of the laser cavity.

There is further provide, according to a preferred embodiment of the present invention, a method for generating an optical pulse, including:

applying radio-frequency (RF) modulation of a predetermined frequency to a saturable absorber (SA) section of an optically-active region in a semiconductor device, the optically-active region comprising a gain section separate from the SA section, so as to generate coherent optical pulses at a repetition rate substantially equal to the predetermined frequency; and coupling an optical output assembly to the optically-active region, so as to form a laser cavity that includes the optically-active region and has a resonant wavelength range substantially defined by the optical output assembly, and such that a period of the repetition rate substantially equals a round-trip time for one of the pulses in the cavity.

Preferably the method includes providing a gain electrode for application of a current to the gain section and an SA electrode for application of the RF modulation to the SA section and a common electrode which acts as a return for the gain electrode and the SA electrode.

Further preferably, the method includes enclosing the semiconductor device by a highly reflecting facet and an antireflection (AR) coated output facet, and wherein coupling the optical assembly to the optically-active region includes coupling the assembly via the AR coated facet.

Preferably, the optical output assembly includes a fiber optic having a fiber Bragg grating (FBG), and the method includes partially reflecting the optical pulses within the resonant wavelength range responsive to a period of the FBG.

Further preferably, the optical output assembly includes one or more lenses, and coupling the optical output assembly includes positioning at least one of the one or more lenses and the fiber optic so as to form the laser cavity.

Preferably, the method includes applying a DC bias current to the SA section.

Preferably, the method includes coupling a passive waveguide section to the optically-active region so as to form the laser cavity.

Further preferably, the method includes positioning the SA section substantially at an optical center of the laser cavity.

The present invention will be more fully understood from the following detailed description of the preferred embodiments thereof, taken together with the drawings, in which:

DETAILED DESCRIPTION OF PREFERRED EMBODIMENTS

Figure 1:
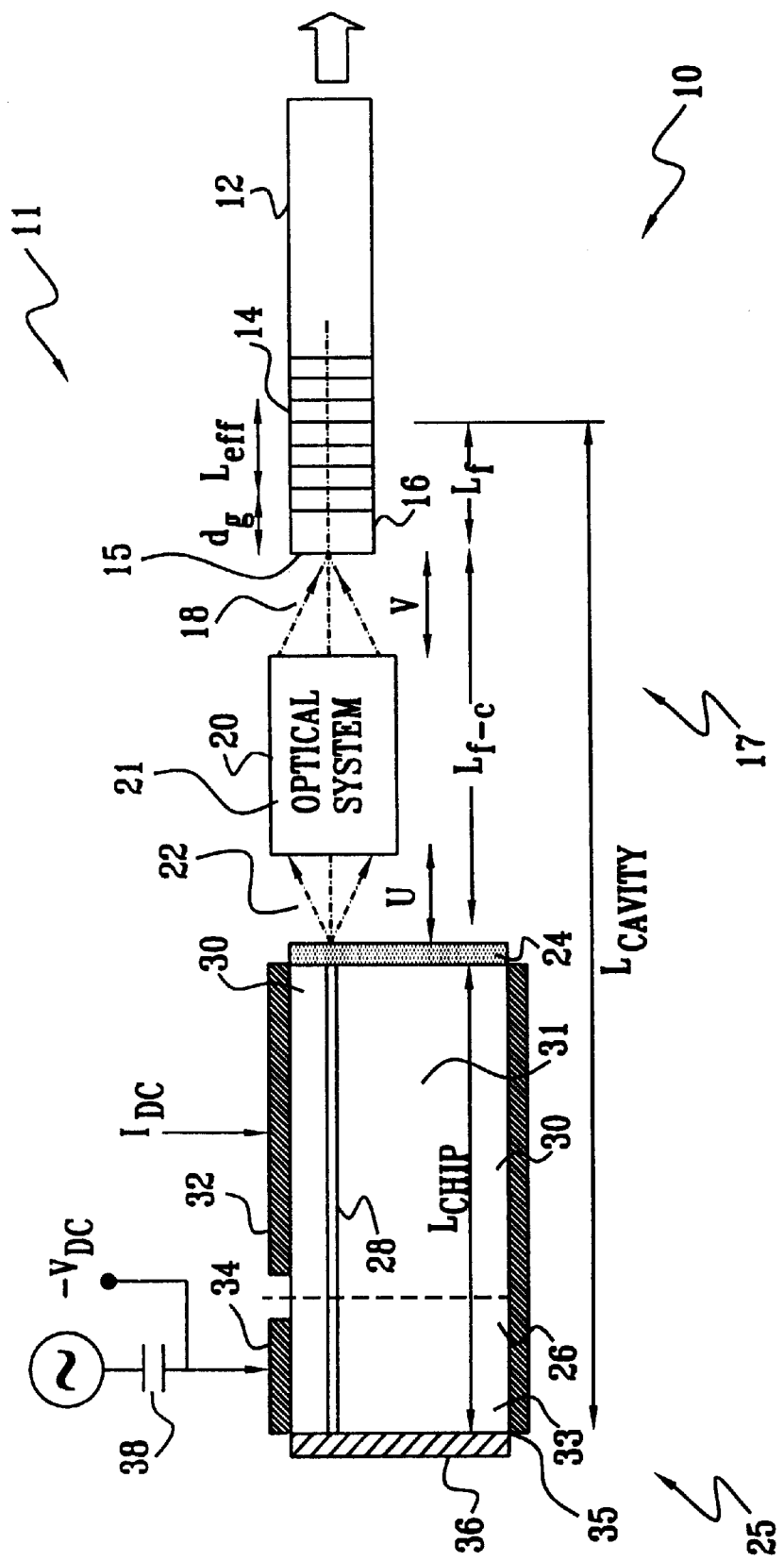
FIG. 1 is a schematic diagram of a Mode-Locked Fiber-Grating Laser (ML-FGL) system, according to a preferred embodiment of the present invention.

Reference is now made to FIG. 1, which is a schematic diagram of a Mode-Locked Fiber-Grating Laser (ML-FGL)

system 10, according to a preferred embodiment of the present invention. An optically-active semiconducting region 28, comprised in a semiconductor laser device 25 having a generally box-like shape, is formed in a gain medium 26 of the device, between non-lasing semiconductor regions 30 of the medium, by methods known in the art. Region 28 has a length, represented by $L_{chip}$, which is of the order of 300 µm–1000 µm, and has a refractive index $n_{chip}$. Device 25 comprises an anti-reflection (AR) coated front facet 24, and a high-reflection (HR) coated back facet 36 which acts as a first mirror of a laser cavity 11.

Device 25 comprises a relatively long gain section 31, controlled by a gain electrode 32, and a very short saturable absorber (SA) section 33, controlled by an SA electrode 34. Electrodes 32 and 34 are coupled to an upper surface of device 25, and a common electrode 35 is coupled to a lower surface of the device. SA section 33 is adjacent to facet 36, and gain section 31 is adjacent to facet 24. Electrode 32 is preferably of the order of 30 µm in length, and electrode 34 is preferably of the order of the remaining length of chip 25. As described in more detail hereinbelow, when region 28 lases it emits coherent diverging light from facet 24, which acts as an output facet.

The diverging light emitted from facet 24 is focussed by an optical system 20 into a fiber optic 12, which comprises a fiber Bragg grating (FBG) 14. FBG 14 acts as a partially reflecting narrow-band mirror, reflecting a portion of the light in a wavelength defined by the grating period back to optical system 20. The non-reflected portion is transmitted into fiber optic 12 to form the output of cavity 11. Optical system 20 focuses light reflected from FBG 14 back to facet 24, so that the optical system couples the FBG to facet 24 of device 25. An optical output assembly 17 comprises optical system 20 and fiber optic 12. Thus device 25, optical system 20, and FBG 14 comprise laser cavity 11, and laser system 10 comprises device 25 coupled to output assembly 17.

Optical system 20 most preferably comprises a single lens 21. Lens 21 is preferably any industrial-standard lens, or alternatively any custom lens, which is able to focus light emitted from facet 24 to FBG 14. Preferably, lens 21 is a bi-convex, aspheric, ball, cylindrical, or graded refractive index (GRIN) lens.

The description hereinbelow explains how lengths of elements of cavity 11 relate to each other in order for the cavity to operate. FBG 14 is assumed to be a distance $D_g$ from a tip 15 of fiber optic 12. The portion of FBG 14 participating in cavity 11 is assumed to have an effective length $L_{eff}$, so that a length $L_f$ of fiber optic 12 participating in cavity 11 is given by:

$$L_f = L_{eff} + D_g \quad (1)$$

A total optical length $L_{cavity}$ of cavity 11 is given by:

$$L_{cavity} = L_{chip} \cdot n_{chip} + u + L_{os} + v + L_f n_f \quad (2)$$

where $L_{chip}$ is the length of region 28, $n_{chip}$ is the refractive index of region 28, $L_{os}$ is an optical length of optical system 20, u is a distance from system 20 to facet 24, v is a distance from system 20 to tip 15, and $n_f$ is a refractive index of fiber optic 12.

For a cavity of optical length $L_{cavity}$, a time taken for the round-trip of a photon within the cavity is $$t = 2 \cdot \frac{L_{cavity}}{c} \quad (3)$$

where c is the speed of light.

Injection of DC current to electrode 32 activates gain section 31 of device 25, enabling cavity 11 to lase, and the cavity will lase continuously except for the effect provided in section 33, wherein the gain is effectively neutralized at specific times. To activate section 33, a DC reverse bias combined with a radio-frequency (RF) modulation is applied to electrode 34. The frequency f of modulation is set to correspond with the round-trip time t, i.e., $$f = \frac{c}{2 \cdot L_{cavity}} \quad (4)$$

The application of an RF modulation at a frequency corresponding to the round-trip time results in mode-locking the laser, and generates pulses at the modulating frequency. The pulses are shortened by combining the DC bias with the RF modulation, which effectively results in shortening the time during the modulation period when the system experiences net gain. Further pulse shortening is achieved by the location of SA section 33 close to HR coated facet 36, so that a pulse collides with its own reflection in section 33.

Figure 2:
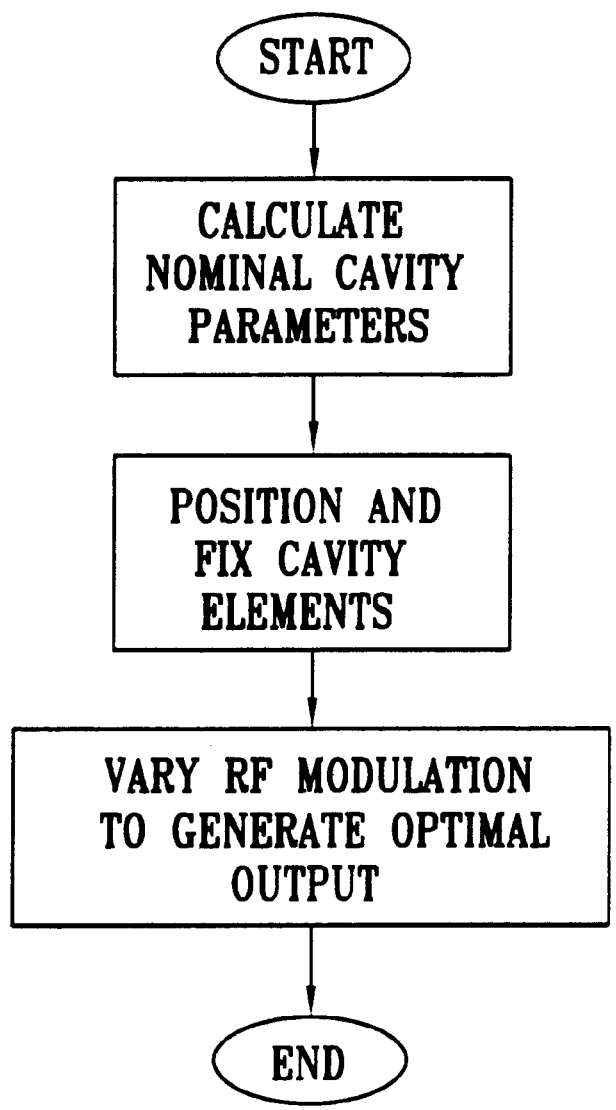
FIG. 2 is a flowchart showing steps for implementing the system of FIG. 1, according to a preferred embodiment of the present invention.

FIG. 2 is a flowchart showing steps for implementing system 10, according to a preferred embodiment of the present invention. Initially nominal values for parameters comprised in the right side of equation (2), so that equation (4) is obeyed for a predetermined frequency, for example 40 GHz, are calculated. System 10 is then implemented, preferably by moving fiber optic 12 relative to device 25 so as to vary values of u and v. Most preferably, while fiber optic 12 is moved, optical system 20 is also moved so as to maintain light output from facet 24 focused onto end 15 of fiber optic 12, and a spectrum of the laser output is monitored until correct mode spacing is achieved. Once positions for fiber optic 12 and optical system 20 have been determined, the fiber optic and optical system are fixed in place.

Once cavity 11 has been constructed, frequency f is injected to SA section 33, and the frequency is varied, most preferably around the predetermined value, until an optimal output from fiber optic 12 is achieved.

Figure 3:
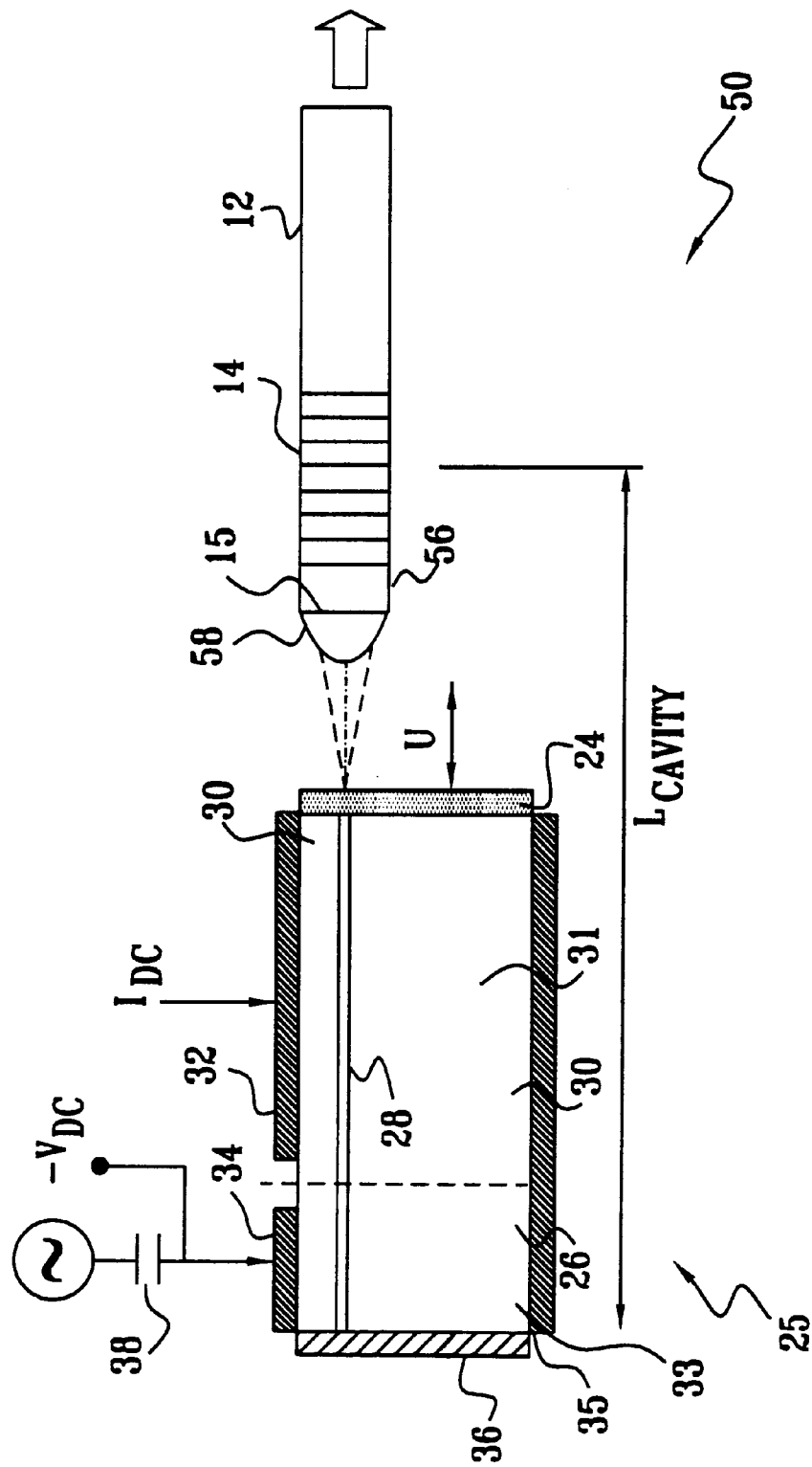
FIG. 3 is a schematic diagram of an alternative ML-FGL system, according to a preferred embodiment of the present invention.

FIG. 3 is a schematic diagram of an ML-FGL system 50, according to a preferred embodiment of the present invention. Apart from the differences described below, the operation of system 50 is generally similar to that of system 10 (FIG. 1), so that elements indicated by the same reference numerals in both systems 50 and 10 are generally identical in construction and in operation. In system 50, optical system 20 preferably comprises a lens 56 which is constructed as an integral part of fiber optic 12. Alternatively, lens 56 is a distinct lens cemented onto tip 15 of fiber optic 12. A radius of a surface 58 of lens 56 is preferably set so that light is substantially focussed from facet 24 into fiber optic 12. Most preferably, distance u between surface 58 and facet 24 is set to be generally equal to the focal length of lens 56. Device 25 is activated, using RF and DC bias injected at electrode 34, and DC current injected at electrode 32, as described above with reference to system 10. System 50 is most preferably implemented substantially as described above for system 10, with reference to FIG. 2. It will be appreciated that system 50 is relatively more compact than system 10, at the cost of having a tuning range which is somewhat smaller, since only distance u can be varied.

Figure 4:
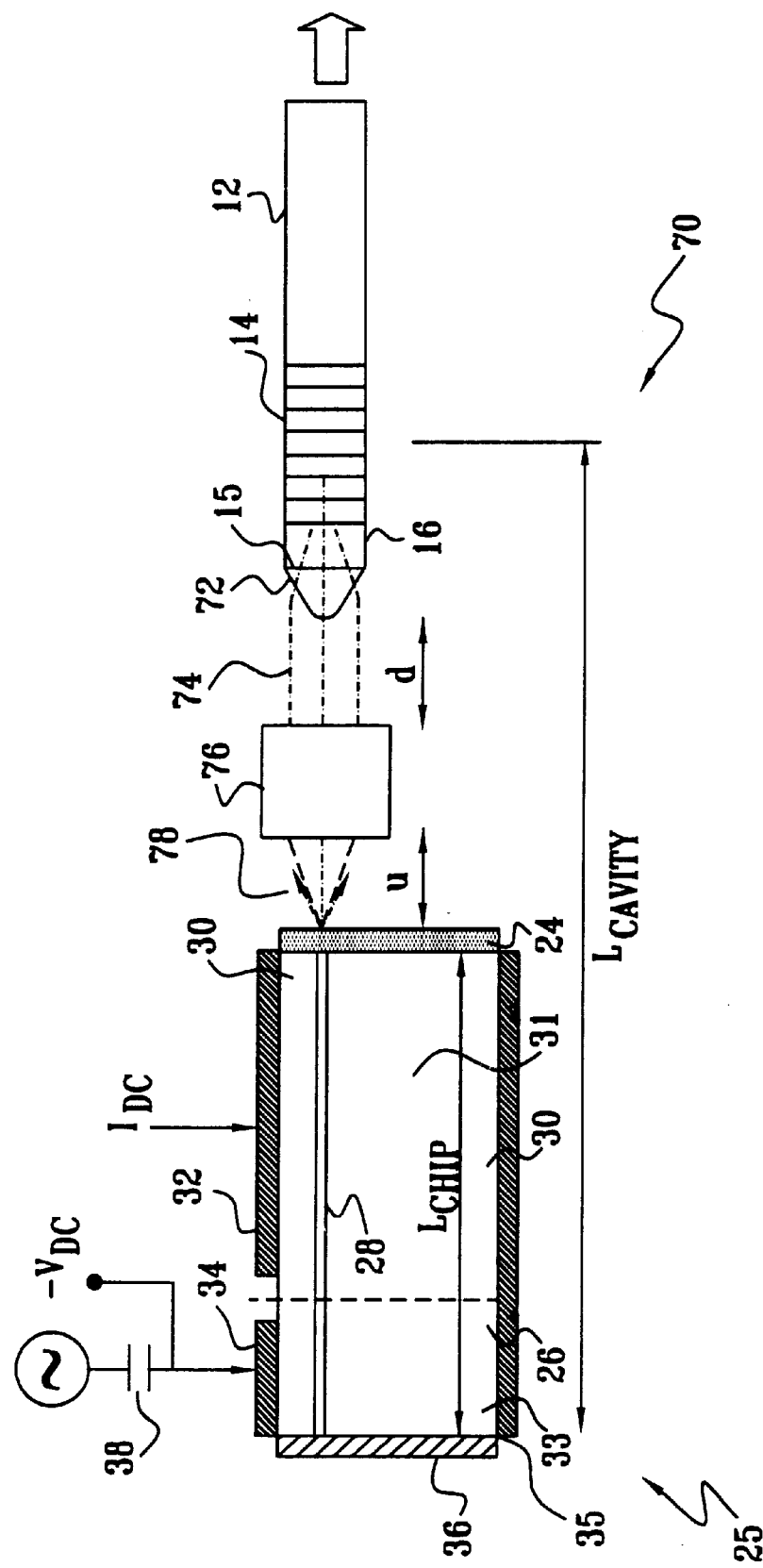
FIG. 4 is a schematic diagram of another alternative ML-FGL system, according to a preferred embodiment of the present invention.

FIG. 4 is a schematic diagram of an ML-FGL system 70, according to a preferred embodiment of the present invention. Apart from the differences described below, the operation of system 70 is generally similar to that of system 10 (FIG. 1), so that elements indicated by the same reference numerals in both systems 70 and 10 are generally identical in construction and in operation. In system 70, optical system 20 comprises a first converging lens 76 and a second converging lens 72, separated by a distance d. Preferably, lens 72 is constructed to be integral with, or is cemented to, fiber optic 12, generally as described above with reference to lens 56 (FIG. 3). Alternatively, lens 72 is generally similar to lens 76, and is separated from tip 15 of fiber 12.

Most preferably, lens 76 has a focal length substantially equal to its distance from facet 24, so that diverging light from the facet is collimated by the lens. Lens 72 focuses the collimated light onto FBG 14. Tuning of system 70 is accomplished by varying the separation of lens 72 and 76, so that system 70 has a relatively large tuning range with substantially constant coupling between facet 24 and FBG 14. System 70 is most preferably implemented as described above with reference to FIG. 2.

Figure 5:
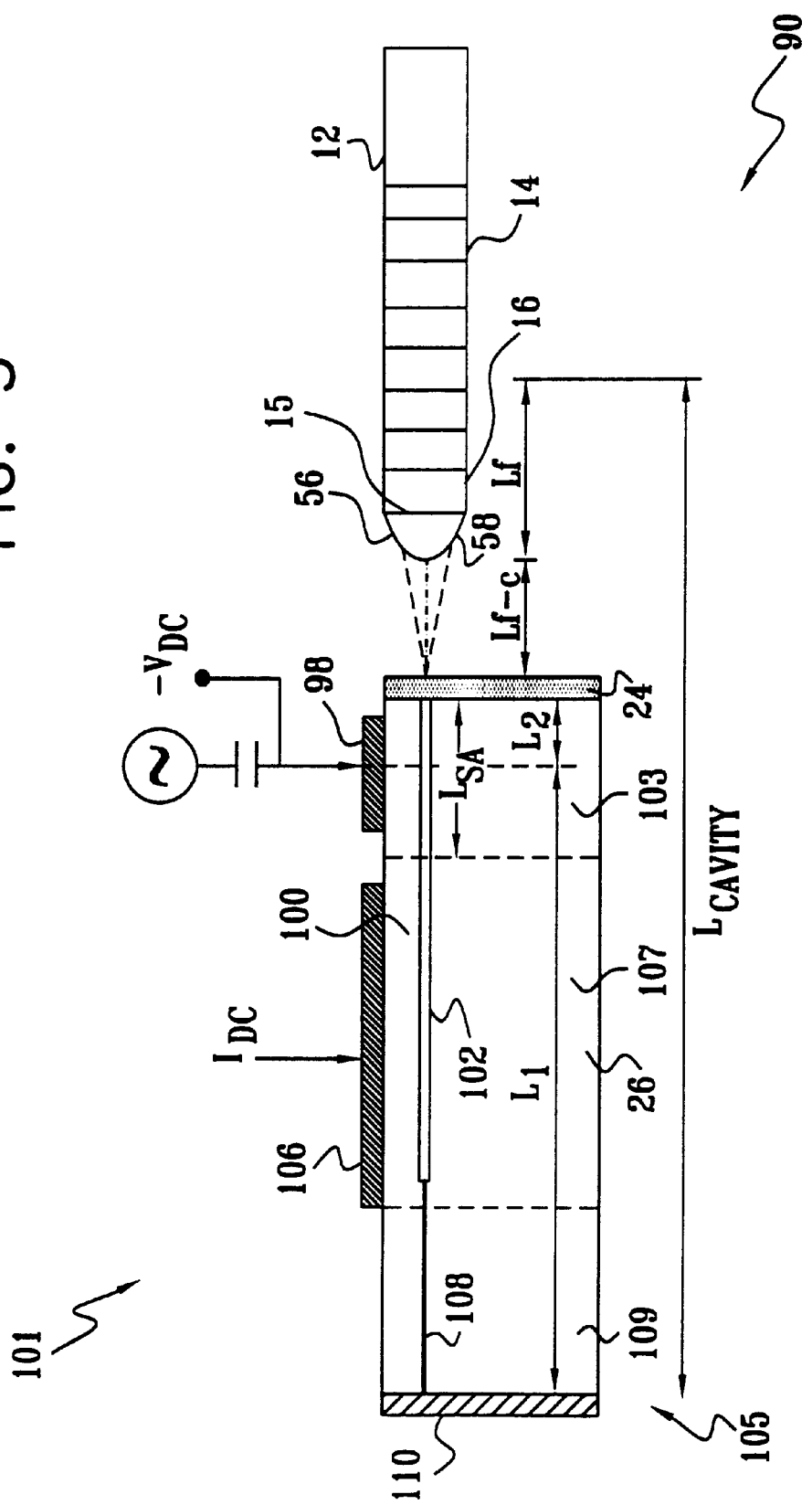
FIG. 5 is a schematic diagram of yet another alternative ML-FGL system, according to a preferred embodiment of the present invention.

FIG. 5 is a schematic diagram of an ML-FGL system 90, according to a preferred embodiment of the present invention. Apart from the differences described below, the operation of system 90 is generally similar to that of system 50 (FIG. 3), so that elements indicated by the same reference numerals in both systems 90 and 50 are generally identical in construction and in operation. System 90 comprises a semiconductor laser device 105 having an SA section 103 of length $L_{SA}$, adjacent to AR coated facet 24, which is implemented and controlled by an SA electrode 98. Device 105 also comprises a central gain section 107 which is implemented and controlled by a central gain electrode 106. Apart from their positioning, SA electrode 98 and gain electrode 106 are respectively substantially similar in construction and operation to SA electrode 34 and gain electrode 32.

Device 105 further comprises a passive waveguide section 109. Section 109 comprises a waveguide 108, which is substantially similar in dimensions to region 28 (FIG. 1) and which is terminated by an HR coated facet 110. Preferably, section 109 comprises a semiconductor having a band-gap causing the semiconductor to be substantially passive and non-absorbing. However, unlike region 28, there is substantially no current injected into section 109, so that waveguide 108 acts as a passive light guide, and a cavity 101 is formed between facet 110 and FBG 14. In cavity 101, lengths of elements of the cavity are set so that an optical length from the center of SA section 103 to facet 110 is substantially equal to an optical length from the center of section 103 to FBG 14. It will be appreciated that each of these optical lengths is substantially equal to half the optical length of cavity 101, so that SA section 103 is substantially at an optical center of the cavity. In this configuration, pulses from section 103, propagating in opposite directions within the cavity, will collide (after reflecting at ends of cavity 101) in the section, and so be shortened.

The description hereinbelow explains how lengths of elements of cavity 101 relate to each other in order for the cavity to operate. Assume that a distance between facet 110 and face 24 is $L_{chip}$, and that a distance from facet 24 to surface 58 is $L_{fc}$. $L_{fc}$ is adjusted so that the optical lengths to the ends of cavity 101, as measured from the center of section 103, are substantially equal.

The optical length from the center of section 103 to facet 110 is given by:

$$\left(L_{chip} - \frac{L_{SA}}{2}\right) \cdot n_{chip} \tag{5}$$

The optical length from the center of section 103 to FBG 14 is given by:

$$\frac{L_{SA}}{2} \cdot n_{chip} + L_{fc} + L_f \cdot n_f \tag{6}$$

Equating equations (5) and (6), and rearranging, gives:

$$(L_{chip} - L_{SA}) \cdot n_{chip} = L_{fc} + L_f n_f \tag{7}$$

In implementing cavity 101, $L_{fc}$ is calculated so that equation (7) is satisfied. System 90 is then most preferably implemented substantially as described above for system 10, with reference to FIG. 2.

It will be appreciated that other methods of coupling device 105 with FBG 14, such as described hereinabove with reference to systems 10 and 70, may be utilized to form cavity 101.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An optical pulse generator, comprising:
   a semiconductor device, which comprises:
      an optically-active region comprising a gain section and a saturable absorber (SA) section, which are adapted to generate coherent optical pulses;
      an output facet for coupling therethrough of the optical pulses generated in the optically-active region; and
      an SA electrode for application of a radio-frequency (RF) modulation of a desired frequency to the SA section; and
   an optical output assembly, optically coupled to the output facet of the semiconductor device so as to partially reflect the coherent optical pulses within a predetermined wavelength range, and positioned so as to form, together with the semiconductor device, a laser cavity having a resonant wavelength within the predetermined wavelength range and having an optical length such that a period of the RF modulation substantially equals a round-trip time for one of the pulses in the cavity, whereby the coherent optical pulses are output through the optical output assembly at a repetition rate substantially equal to the RF modulation.

2. A generator according to claim 1, wherein the semiconductor device comprises a gain electrode for application of a current to the gain section.

3. A generator according to claim 2, wherein the current comprises a substantially DC current.

4. A generator according to claim 2, wherein the semiconductor device comprises a common electrode which acts as a return for the gain electrode and the SA electrode.

5. A generator according to claim 1, wherein the semiconductor device comprises a highly reflecting facet which together with the output facet encloses the optically-active region.

6. A generator according to claim 1, wherein the output facet is coated by an antireflection coating.

7. A generator according to claim 1, wherein the optical output assembly comprises a fiber optic having a fiber Bragg grating (FBG) which partially reflects the optical pulses within the predetermined wavelength range responsive to a period of the FBG, and wherein the fiber optic transmits the optical pulses.

8. A generator according to claim 7, wherein the optical output assembly comprises one or more lenses which focus the coherent optical pulses between the fiber optic and the output facet.

9. A generator according to claim 8, wherein the one or more lenses comprise a lens fixedly coupled to the fiber optic.

10. A generator according to claim 8, wherein at least one of the one or more lenses and the fiber optic are positioned so as to form the laser cavity.

11. A generator according to claim 1, and comprising a DC bias current which is applied to the SA electrode.

12. A generator according to claim 1, wherein the gain section is positioned adjacent to the output facet.

13. A generator according to claim 1, wherein a length of the SA section is substantially less than a length of the gain section.

14. A generator according to claim 1, wherein the semiconductor device comprises a passive waveguide section coupled to the optically-active region so as to form the laser cavity.

15. A generator according to claim 14, wherein the semiconductor device comprises a highly reflecting facet which together with the output facet encloses the optically-active region and the passive waveguide section, and wherein the SA region is positioned adjacent to the output facet, so that a first optical length from the SA section to the highly reflecting facet is substantially equal to half a second optical length of the laser cavity.

16. A method for generating an optical pulse, comprising:
applying radio-frequency (RF) modulation of a predetermined frequency to a saturable absorber (SA) section of an optically-active region in a semiconductor device, the optically-active region comprising a gain section separate from the SA section, so as to generate coherent optical pulses at a repetition rate substantially equal to the predetermined frequency; and
coupling an optical output assembly to the optically-active region, so as to form a laser cavity that includes the optically-active region and has a resonant wavelength range substantially defined by the optical output assembly, and such that a period of the repetition rate substantially equals a round-trip time for one of the pulses in the cavity.

17. A method according to claim 16, and comprising providing a gain electrode for application of a current to the gain section and an SA electrode for application of the RF modulation to the SA section and a common electrode which acts as a return for the gain electrode and the SA electrode.

18. A method according to claim 16, and comprising enclosing the semiconductor device by a highly reflecting facet and an antireflection (AR) coated output facet, and wherein coupling the optical assembly to the optically-active region comprises coupling the assembly via the AR coated facet.

19. A method according to claim 16, wherein the optical output assembly comprises a fiber optic having a fiber Bragg grating (FBG), and comprising partially reflecting the optical pulses within the resonant wavelength range responsive to a period of the FBG.

20. A method according to claim 19, wherein the optical output assembly comprises one or more lenses, and wherein coupling the optical output assembly comprises positioning at least one of the one or more lenses and the fiber optic so as to form the laser cavity.

21. A method according to claim 16, wherein applying the RF modulation comprises varying a frequency of the modulation, and wherein coupling the optical output assembly comprises varying a position of an element of the assembly, so that a resonant length of the cavity remains substantially the same.

22. A method according to claim 16, and comprising applying a DC bias current to the SA section.

23. A method according to claim 16, and comprising coupling a passive waveguide section to the optically-active region so as to form the laser cavity.

24. A method according to claim 23, and comprising positioning the SA section substantially at an optical center of the laser cavity.

* * * * *